United States Patent [19]
Okubo et al.

[11] Patent Number: 5,490,084
[45] Date of Patent: Feb. 6, 1996

[54] METHOD AND APPARATUS FOR DETECTING BENT LEADS IN ELECTRONIC COMPONENTS

[75] Inventors: Narihito Okubo, Narashino; Masao Tsuji, Shimizu; Tomoya Tomita, Narita; Tadaaki Kadoya, Funabashi; Hiroyasu Kato, Chiba; Shingo Fujioka, Shimizu, all of Japan

[73] Assignee: Hitachi Techno Engineering Co., Ltd., Tokyo, Japan

[21] Appl. No.: 209,201

[22] Filed: Mar. 4, 1994

Related U.S. Application Data

[63] Continuation of Ser. No. 445,637, Jan. 30, 1990, abandoned.

[30] Foreign Application Priority Data

Jun. 1, 1987 [JP] Japan ................. 62-134980

[51] Int. Cl.⁶ ................................. H01L 23/48
[52] U.S. Cl. ................. 364/489; 382/145; 348/87; 348/126
[58] Field of Search .................. 364/488, 489, 364/490; 382/8; 348/87, 94, 126

[56] References Cited

U.S. PATENT DOCUMENTS

| | | | |
|---|---|---|---|
| 4,728,195 | 3/1988 | Silver | 356/394 |
| 4,737,845 | 4/1988 | Susuki et al. | 358/101 |
| 4,907,701 | 3/1990 | Kobayashi et al. | 209/576 |
| 5,058,177 | 10/1991 | Chemaly | 382/8 |

FOREIGN PATENT DOCUMENTS 14449  1/1987  Japan.

*Primary Examiner*—Vincent N. Trans
*Attorney, Agent, or Firm*—Fay, Sharpe, Beall, Fagan, Minnich & McKee

[57] ABSTRACT

Electronic components such as integrated circuit components have rows of parallel leads extending from the sides of their bodies. In detecting bent leads of an electronic component, at least two measuring lines are set along each row of leads. The intersections between the measuring lines and the leads are extracted and processed to detect a bend in leads. The electronic component is photographed to produce image data which is stored in a memory. At least two measuring lines are virtually set along the row of leads of the image data stored in the memory. An intersection extractor extracts, from the image data, the intersections between the measuring lines and predetermined leads in the row of leads. A detector then uses the extracted intersections to detect bent leads.

12 Claims, 12 Drawing Sheets

VERTICAL BEND AT THE TIP OF THE LEAD(2c OR 2d)

DATA D1

DIRECTION OF MEASUREMENT(ON L1) COORDINATES

DATA D2

DIRECTION OF MEASUREMENT(ON L2) COORDINATES

METHOD AND APPARATUS FOR DETECTING BENT LEADS IN ELECTRONIC COMPONENTS

This is a continuation application of Ser. No. 07/445,637, filed Jan. 30, 1990 now abandoned.

TECHNICAL FIELD

This invention relates to a technique of detecting bent leads as in integrated circuit components of surface-mounting flat package type and more particularly to a method and an apparatus for detecting bent leads in electronic components, which are suitably used in combination with a visual sensor for automatically mounting electronic components on printed circuit cards.

BACKGROUND ART

A wide range of electronic circuits employ printed circuit cards. These printed circuit cards in general have come to be manufactured by automatic fabrication machines in recent years. A variety of automatic IC component mounting apparatuses or automatic assemblers have been proposed and put to practical use.

The electronic components mounted on the printed circuit cards have many parallel leads arranged on all sides. If an integrated circuit component has any bent leads, current connection between the IC component and the wiring pattern on the card cannot be obtained. To avoid this, inspection must be made to detect any deformed leads so that only those IC components with correct leads can be brought onto the printed circuit card.

Explanation will be given as to the bent leads by referring to FIG. 2. FIG. 2(a) is a plan view of a flat package type IC component, in which reference numeral 1 represents a body of the integrated circuit component and 2 represents its leads. Bent leads are shown by 2a and 2b. FIG. 2(b) is a side view showing bent leads 2c and 2d. In the following description, the bend of the leads 2a, 2b in FIG. 2(a) along the direction of the row of leads is called a lateral bend while that of the leads 2c, 2d in FIG. 2(b) in a direction perpendicular to the row is called a vertical bend.

The automatic assembler has a suction hand to carry IC components placed at a specified location to the printed circuit card and to correctly position the IC components on the card. This process is done as follows. After holding an IC component, the suction hand is stopped at a predetermined position and the IC component holding position of the suction hand is checked. According to the result of the check of the holding position, the suction hand position on the card is controlled to ensure a sufficient accuracy for the IC component mounting position. For detection of the IC component holding position of the suction hand, a video camera is used to take a picture of the IC component held on the suction hand to obtain plan view image data, from which the IC component holding position is determined. This is a conventional method of positioning, Taking advantage of the image data, various method of checking for bent leads are possible.

Although these methods are not published in technical literatures, one example technique is to digitize the image data into binary values, calculate by using the digitized data the center of gravity of each lead, detect the distance between the gravity centers as a lead pitch, and compare the calculated lead pitch with a preset value to detect any bent lead.

To apply this method to the bent lead detection, however, requires a reasonably high resolution of the image data, so that the image data that is used for detecting the IC component holding position is not sufficient. Bent lead detection also requires additional data, such as a wide-angle view of image data with larger number of pixels, which causes various problems, such as a necessity to take pictures several times for each IC component and an increased data processing time, prolonging the card assembly processing time. That is, since the above conventional technique uses digitized binary image data, those data concerning the edges of leads easily become unstable, making it difficult to measure the lead pitch of general size or about 0.3 mm with high accuracy. Therefore, image data as obtained through the wide-angle view which has a greater number of pixels is needed. That is, the common use of the image data that is intended for the position detection in the automatic assembler fails to meet the requirements for the bent lead detection. And application of such a technique to the bent lead detection will result in an increase in the processing time for each IC component.

The inventor has proposed an invention associated with the Japanese Patent Application No. 147066/1986, which disclosed a technique whereby the plan view image data of an IC component is used to extract data concerning the part of leads where they are transversely cut by a straight line running parallel with the row of leads and, according to the pattern of shading of the extracted data, any lead bend is detected.

A series of leads of the flat package type IC component, when photographed using reflected light, produces a lighter image than the background, providing a certain contrast. Depending on the angle of reflection from the lead, the reflected light quantity changes, exhibiting less contrast with the background. Thus, for the leads with such characteristics, the brightness distribution on a measuring line (straight line) running across the series of leads and along the lead row exhibits a periodical variation according to the condition of lead arrangement.

The above-mentioned patent application makes use of this shade variation to allow easy detection of any bent leads in the components.

A Japanese Patent Application Laid-Open No. 1900/1985 may be cited as an example of the above technique.

These preceding patent applications, however, have a drawback that since the relative positional relationship with adjacent leads is used for detecting the lateral bend of a lead, when a plurality of leads are bent in the same direction as a whole, detection of bends is difficult. The foregoing patent applications have no considerations in this regard and therefore an error would occur in the measurement of the coordinates of the IC component's center position and of angular misalignment.

DISCLOSURE OF THE INVENTION

The object of this invention is to provide a method and apparatus which can detect bent leads, in any form or condition, in electronic components.

Another object of the invention is to provide a method and apparatus which can detect parallel bends of leads in electronic components.

A further object of the invention is to provide a method and apparatus which can detect lateral bends of leads in electronic components with high accuracy.

A further object of the invention is to provide a method and apparatus which can detect vertical bends of leads in electronic components with high accuracy.

A still further object of the invention is to provide a method and apparatus which can automatically detect bent leads in electronic components.

To achieve the above objectives, this invention sets at least two measuring lines for each row of leads in an electronic component and extracts intersections between the measuring lines and the leads to detect bent leads.

The lateral bend in a lead appears as a difference in lateral position between two points on the lead which are separated in the lead length direction. The two measuring lines pass through points on the lead separated along the lead length. The image data on leads at the intersections with two or more measuring lines are compared with each other and the lateral bends of the leads are detected as the deviation of the image data. This allows not only the detection of individual lateral bends relative to the adjacent leads but also the detection of uniform lateral bends of all leads on a side.

Since this technique utilizes comparison between a plurality of one-dimensional image data, it is not adversely affected by variations in lead reflection factor due to differing kinds or lots of IC component or by variations in brightness during photographing. Thus high accuracy is maintained.

Detection of bent leads may also be accomplished by using the intersections between each lead and plural measuring lines. It is also possible to check the relative position of such intersections with respect to the adjacent leads. Further, the intersections of all leads in a row may be used in checking for a bend on individual leads. For detecting the parallel bends, in particular, the intersections between the measuring lines and the leads located at each end of the row of leads may be used to calculate the center points of the row of leads along the measuring lines, which are then compared with each other to detect any bends.

It is simplest to use two straight measuring lines. It is desirable in improving the detection accuracy to set these two straight lines for each row of leads in such a way that one straight line is set close to the body of the electronic component and the other close to the tip of the leads.

The automatic detection of bent leads is accomplished in the following manner. The electronic component is photographed by the photographing device and the image data is stored in a frame memory, a memory means. The measuring lines are set on the frame memory. The setting of the measuring lines on the frame memory may be done either by virtually setting a series of predetermined coordinates on the frame memory as the measuring lines or by defining the series of coordinates by an equation. The measuring lines can be set at predetermined positions on the frame memory if the electronic component can be positioned in place relative to the photographing device with a specified accuracy. When the electronic component cannot be positioned with a specified accuracy, virtual measuring lines may be set on and along the row of leads on the frame memory by using the image data stored in the frame memory.

BEST MODE FOR CARRYING OUT THE INVENTION

Figure 1:
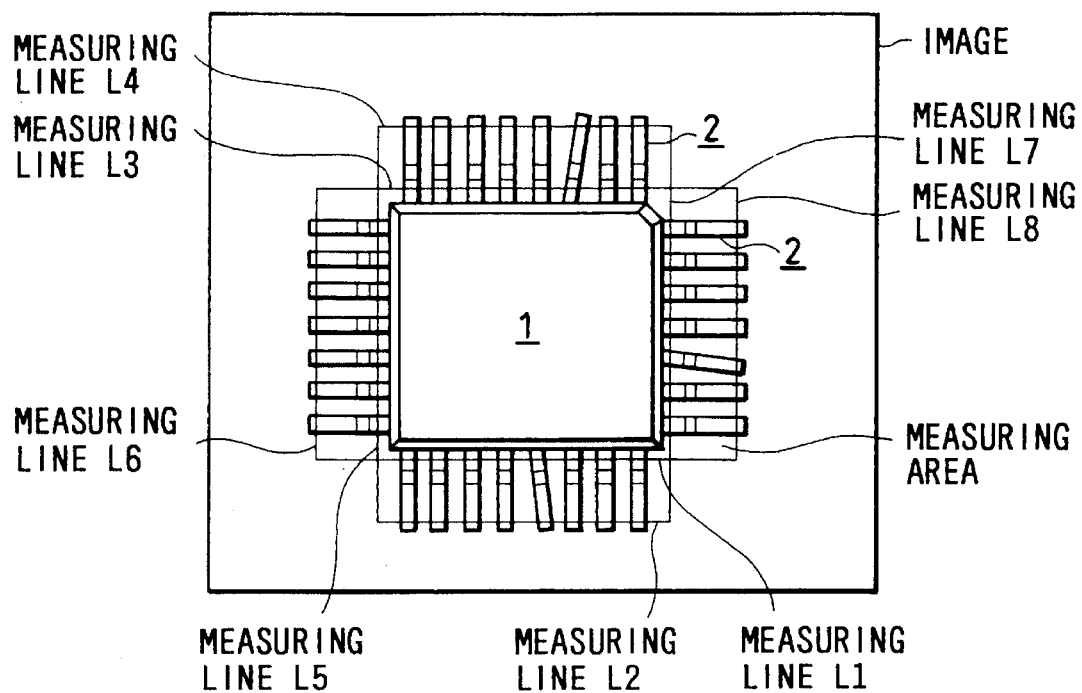
FIG. 1 is an explanatory drawing showing the principle of the IC lead bend detecting apparatus according to this invention.

The method of detecting IC leads according to this invention will be described in detail by referring to the embodiments illustrated in the drawings.

Figure 3:
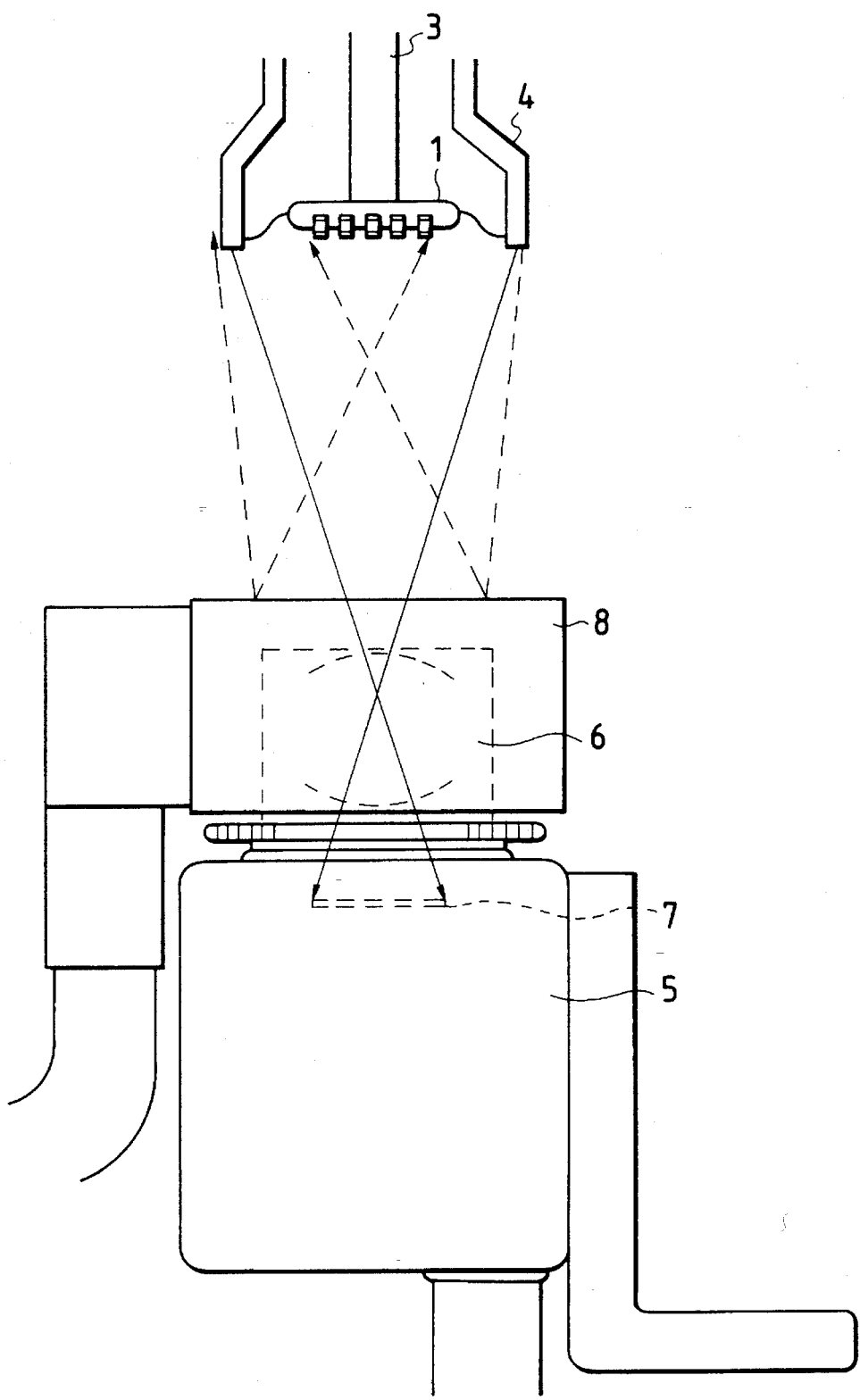
FIG. 3 is a photographing system configuration as one embodiment of the invention.

FIG. 3 shows one embodiment of the invention, in which reference numeral 1 represents a flat package type IC component, 3 a suction hand, 4 a chuck for rough positioning, 5 a TV camera, 6 a lens, 7 an image plate, and 8 an illuminating device.

This embodiment is the automatic IC component assembler to which the present invention is applied. The suction hand has a chuck 4 and holds by suction an IC component 1 placed at a predetermined location, carries it to a specified position where a printed circuit card is located, and then positions the IC component. The chuck 4 roughly adjusts the attitude of the IC component 1 with respect to the suction hand 3.

While carrying the IC component 1 placed at the predetermined position to over the printed circuit card, the suction hand 3 stops at a specified position.

The TV camera 5 is mounted immediately below where the suction hand 3 temporarily stops. The lens 6 is preadjusted so that the image of the IC component 1 is focused on the image plate 7. At the timing that the suction hand 3 stops, the TV camera 5 takes picture of the IC component 1 held by the suction hand 3 and the image data is then stored in memory (frame memory not shown).

The image data stored in the memory is processed to determine the holding position of the IC component 1 with respect to the suction hand 3 as well as the attitude of the IC component. Then the position with respect to the printed circuit card is corrected. Further, by processing the image data stored in the memory, bent lead detection is performed on the leads 2 of the IC component 1 to determine whether the IC component 1 is good or bad. When the IC component 1 is decided as faulty, it is discarded.

Next, we will explain the process of detecting the bends in the IC leads 2 by using the image data.

The image of the IC component 1 formed by the apparatus of FIG. 3 is as shown in FIG. 1. For each row of leads, two measuring lines L1/L2, L3/L4, L5/L6, and L7/L8 are set to cross the leads in the image. Then data D1 to D8 extracted along these measuring lines are prepared.

Figure 2A:
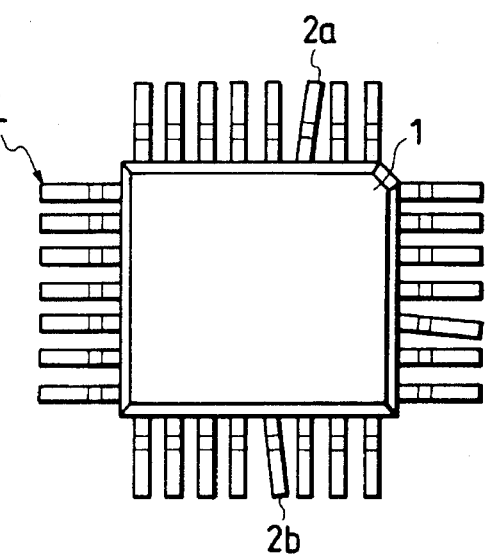
FIGS. 2(a), 2(b) are explanatory views showing bent leads in a flat package IC.
Figure 2B:
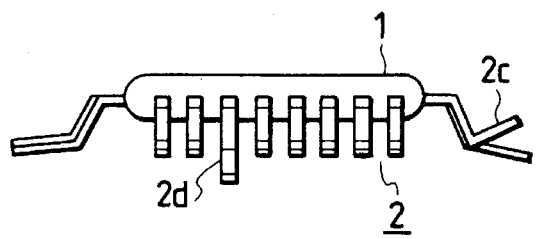

As described earlier in FIG. 2, there are two types of bent leads in IC components, a lateral bend (FIG. 2(a)) and a vertical bend (FIG. 2(b)).

First, we will explain about the detection of lateral bends.

Figure 4A:
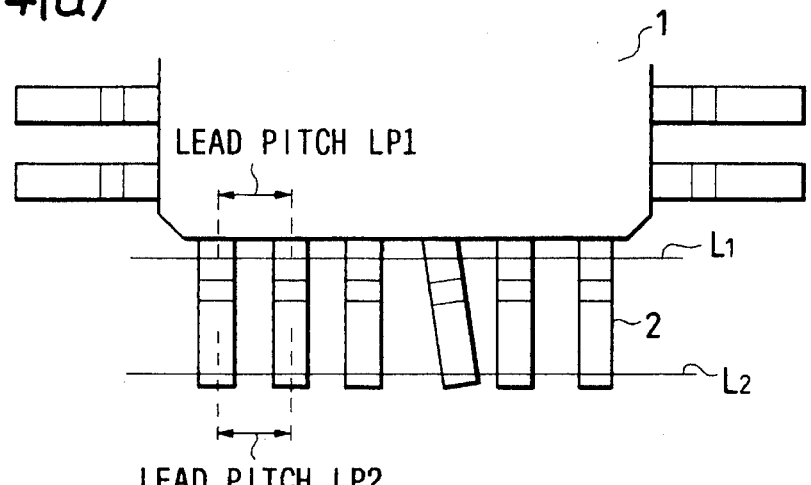
FIGS. 4(a) to 4(c) are explanatory drawings of the embodiment showing how the lateral bend is detected.
Figure 4B:
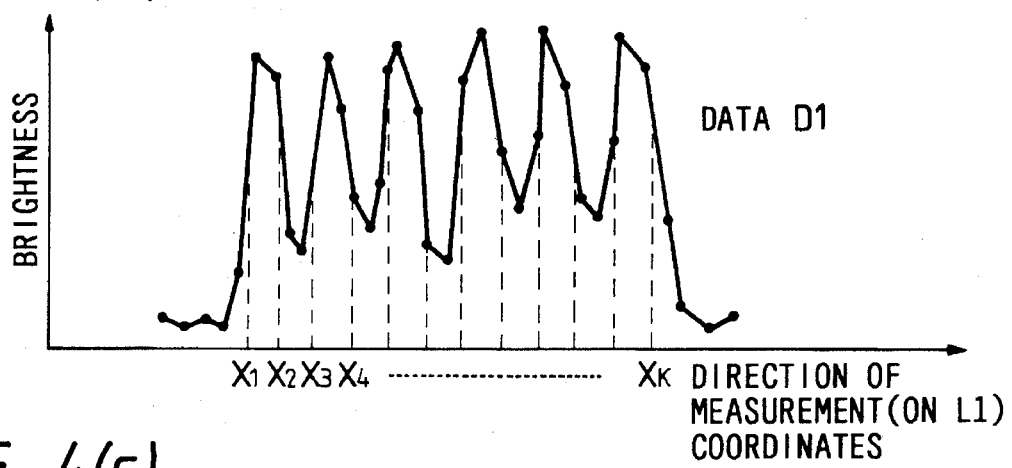
Figure 4C:
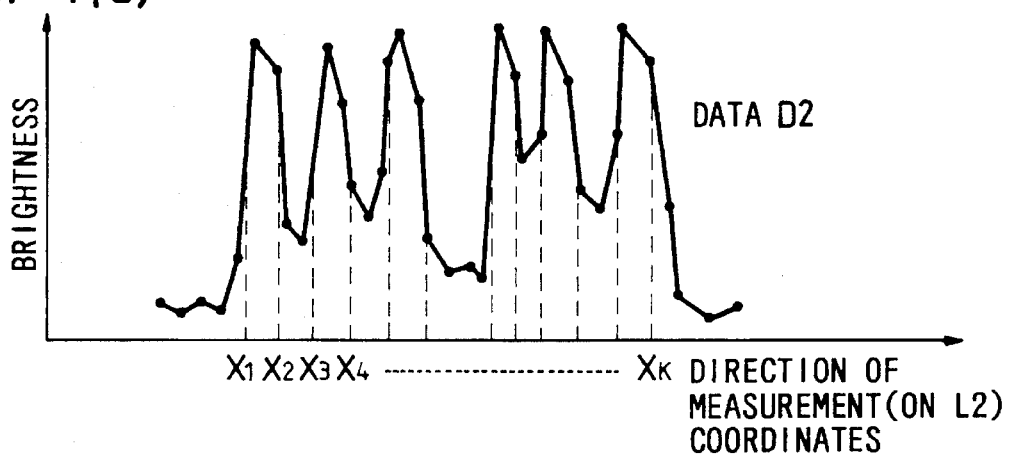

Suppose the lateral bend is to be detected in the row of leads through which the measuring lines L1 and L2 are set to pass. The image data D1 corresponding to the measuring line L1 and the image data D2 along the measuring line L2 have brightness variations as shown in FIGS. 4(b) and 4(c), respectively.

From the image data stored in grid form in the frame memory, data D1 and D2 corresponding to the measuring lines L1 and L2 are extracted. These data are processed to calculate a weighted mean according to the formula shown below. The value of the weighted mean is taken as a coordinate value Xk of the lead edge.

$$Xk = \frac{\sum_{i=m}^{n} \left(i + \frac{1}{2}\right) [|f(i+1) - f(i)|]}{\sum_{i=m}^{n} [|f(i+1) - f(i)|]} \qquad (1)$$

where

Xk: Coordinates of lead edge in the direction of the measuring line m: A point at which a monotonic increase or decrease in brightness level begins n: A point at which a monotonic increase or decrease in brightness level ends f(i): Data of brightness at coordinates i.

The range of monotonic increase or monotonic decrease is the range of brightness variation in which the brightness components are in the same direction, and it is determined by the following conditions.

$$|f(n) - f(m)| \geq Dth \qquad (2)$$

where

Dth: Brightness gradient threshold.

The edge coordinates determined by the above formula (1) are detected at high accuracy within one pixel.

From these edge coordinates, the pitch between the adjacent leads is calculated for each data D1 and D2. A lead pitch for data 1, i.e., along the measuring line L1 passing through the base portion of the leads where lateral lead bends will not easily occur, is designated $L_{p1}$. A lead pitch for data 2, i.e., along the measuring line L2 passing through the end portion of the leads where lateral bends will easily occur, is designated $L_{p2}$.

These lead pitches $L_{p1}$, $L_{p2}$ are compared to decide whether there are any lateral bends on the leads by checking if the following condition is met. The IC components that have been identified as having a lateral bent lead are treated as faulty components.

$$L_{p1} - L_{p2} < \gamma \qquad (3)$$

where

γ: a specified threshold value

In this embodiment, therefore, a check is made by comparing the images of the base portion and the end portion of the lead 2, so that there is no possibility of the check being affected by the variations in reflection factor on the lead surface due to differing kinds or lots of IC components or by variations in illuminating conditions while taking an image of the IC component. Hence, it is possible to determine the magnitude of the lead bend with high accuracy, and the image data, which was produced for automatic assembling of IC components onto the printed circuit card, can be used as is also for detecting lead bends easily.

Next, the process of detecting the vertical bends is explained.

Returning to FIG. 3, the illuminating device in this embodiment is a ring light source 8 which consists of a series of optical fibers arranged to encircle the lens 6, each optical fiber forming a small spot light directed upward. Illuminated by this device, the IC component 1 is photographed.

Figure 5:
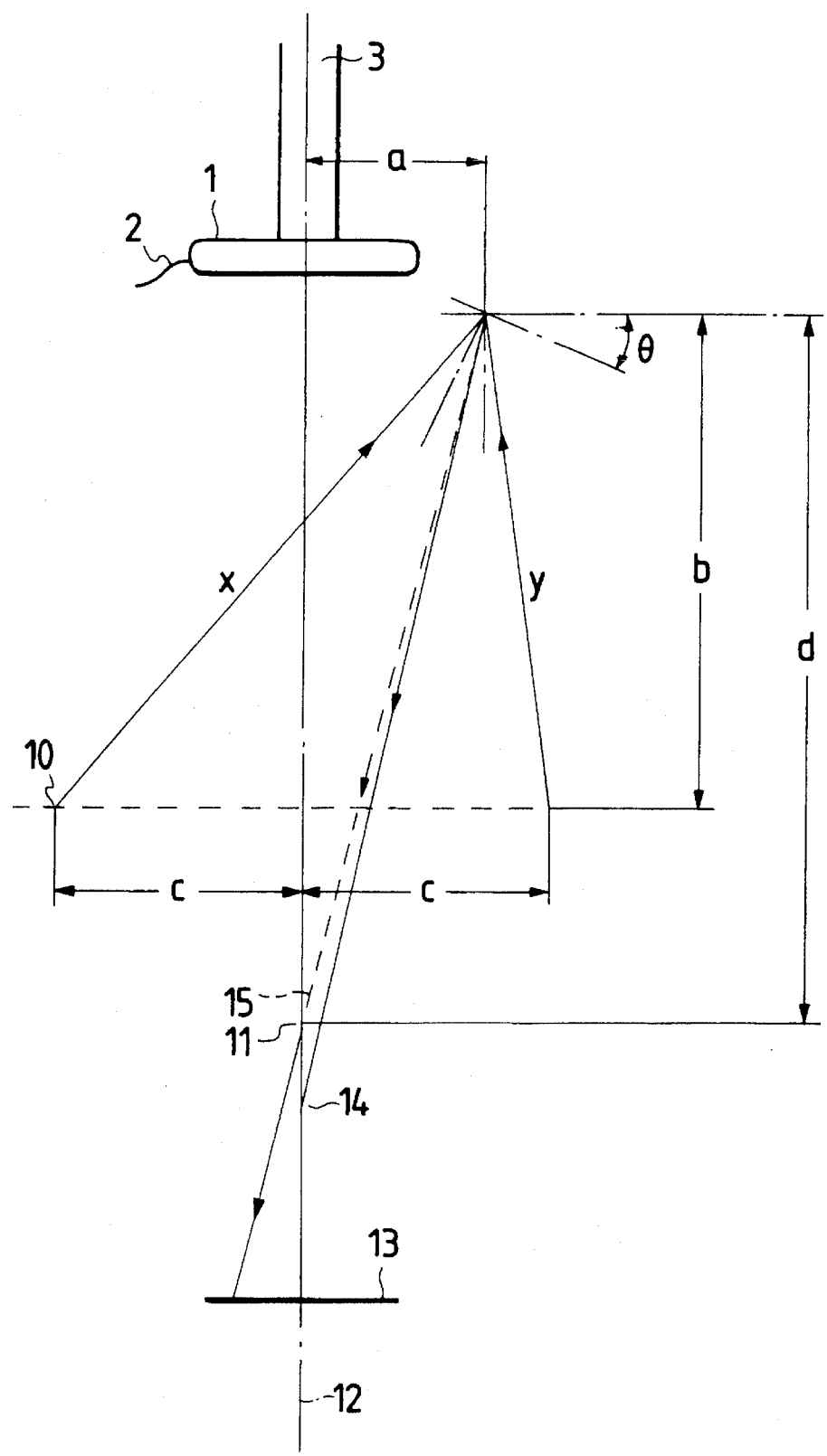
FIG. 5 is an explanatory view of an optical system used in the embodiment of the invention.

How the image of the lead 2 is formed in the optical system of this embodiment is shown in FIG. 5.

In the figure, reference numeral 10 designates a light emitting aperture formed by the optical fiber ring in the illuminating device 8, 11 an optical center of the lens 6, 12 a lens light axis, 13 an image on the image plate 7, 14 a front principal point of the lens 6, and 15 a rear principal point.

Radiated light beams x, y from the light emitting aperture 10 is totally reflected at the back surface of the lead 2 and focuses on the image plate 7.

As the light emitting aperture is sufficiently small so that the light can be deemed as a spot light source, the brightness of the lead 2 on the image plate varies depending on the angle θ of the lead 2 from the horizontal surface, i.e., the magnitude of bend of the lead 2.

The angle θ at which the lead image on the image surface 13 receives the maximum quantity of light is determined as follows.

$$\theta x = \frac{1}{2}[2\pi - \text{Tan}^{-1} d/a - \text{Tan}^{-1} b/(a+c)] \qquad (4)$$

$$\theta y = \frac{1}{2}[\pi - \text{Tan}^{-1} d/a + \text{Tan}^{-1} (a-c)/b] \qquad (5)$$

where a: Distance from the light axis of the lens to the reflecting surface (point) of the lead;

b: Distance from the light emitting aperture to the reflecting surface (point) of the lead;

c: Distance from the light axis of the lens to the light emitting aperture; and d: Distance from the reflecting surface (point) of the lead to the light axis of the lens.

Figure 6A:
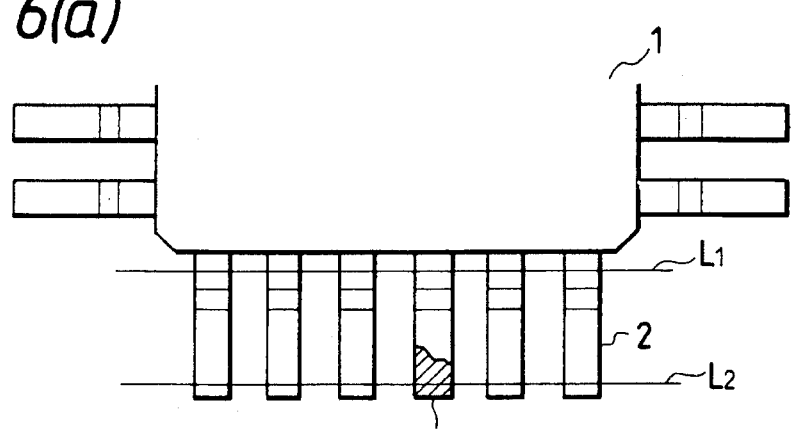
FIGS. 6(a) to 6(c) are explanatory drawings of the embodiment showing how the vertical bend is detected.
Figure 6B:
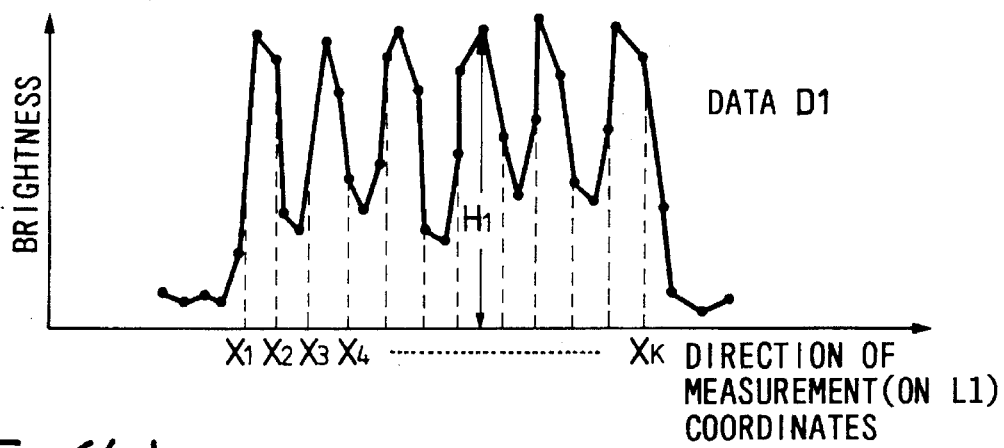
Figure 6C:
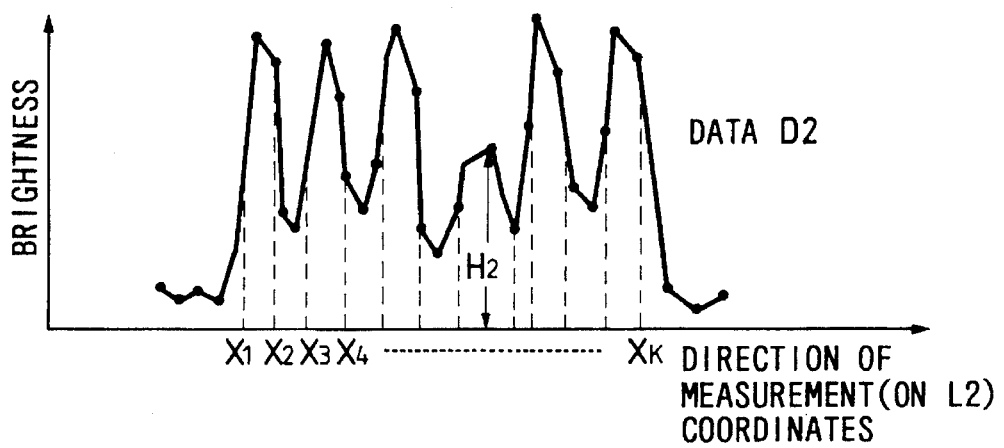

In this embodiment, various parts are arranged to give appropriate values to the constants a, b, c, d in the expressions (4) and (5) so that the quantity of reflected light from the lead that has its tip vertically bent at an angle of θ, as with lead 2c, 2d of FIG. 2(b), will be reduced. When an IC component 1 with a vertically bent lead as shown in FIG. 6(a) is examined by the image, the lead 2c or 2d of the IC component in FIG. 2(b) with a vertical bend produces a dark image at its tip, as shaded in FIG. 6(a). The brightness levels according to the data D1, D2 along the measuring lines L1 and L2 are as shown at (b) and (c) of FIG. 6. It is seen that the brightness level at one lead according to data D1 is H1 while that of the same lead according to data D2 is H2.

The brightness levels obtained from data D1 and data D2 are compared to check if the following condition is satisfied.

$$H1 - H2 < \beta \qquad (6)$$
(β: a specified threshold value)

If the above condition (6) is not met, it is decided that the IC component has a vertically bent lead.

Since the check is made by comparing two data— data D1 for the lead base portion and D2 for the tip portion—the detection is free from adverse effects of variations in conditions, and high accuracy can easily be maintained.

Furthermore, the above embodiment employs the optical fiber ring illuminating device 8 as shown in FIG. 3 which performs the action as described in FIG. 5, so that variation in image brightness at the vertically bent portion will sharply show, allowing high precision detection of bends.

This invention also permits accurate detection of so-called lateral parallel bends in which a plurality of leads in one row in the IC component 1 are bent in the same direction. This is described in conjunction with the above embodiment.

Figure 7A:
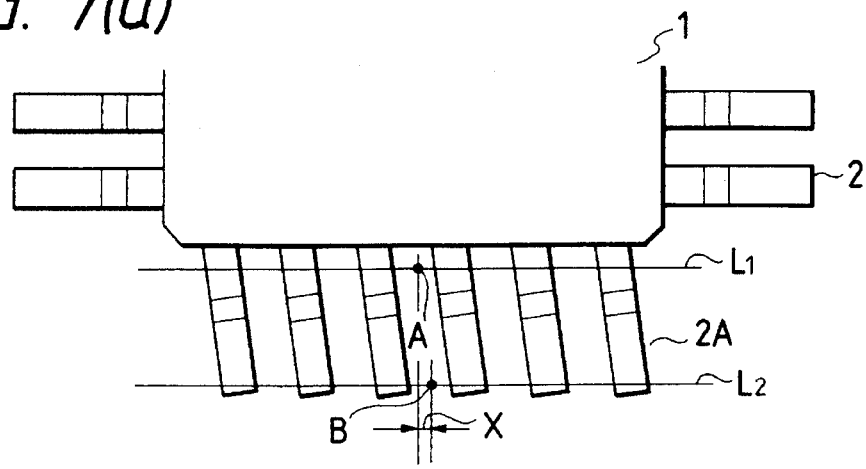
FIGS. 7(a) to 7(c) are explanatory drawings of the embodiment showing how the lateral, parallel bends are detected.
Figure 7B:
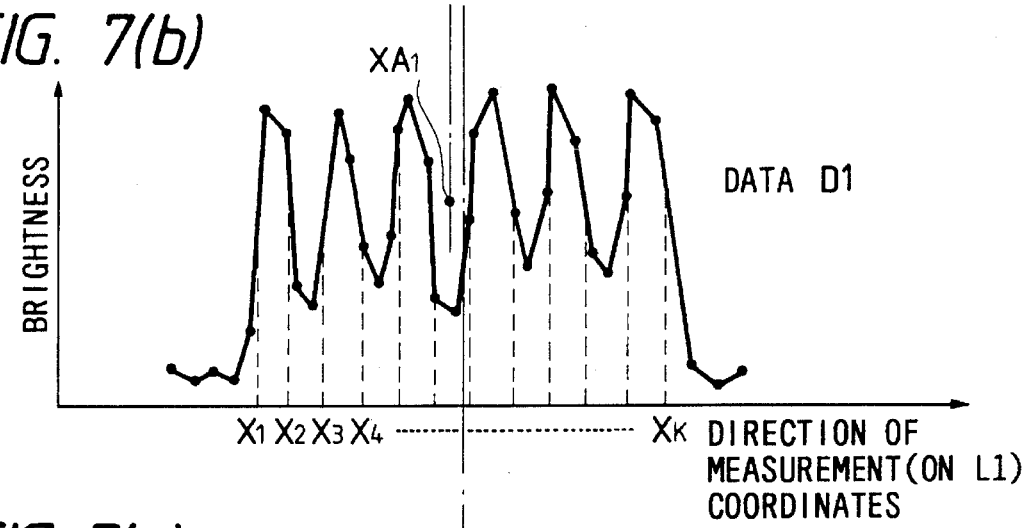
Figure 7C:
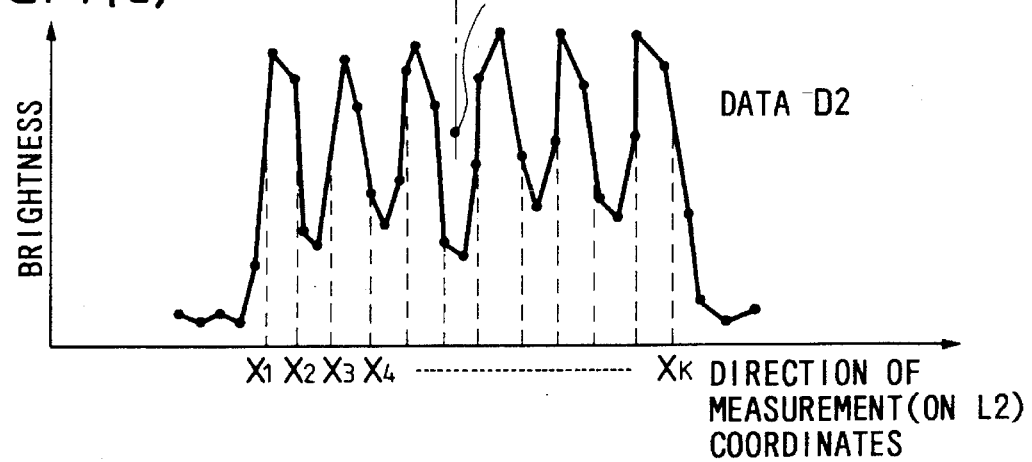

In the image of an IC component 1 shown in FIG. 7(*a*), the brightness level according to data D1 along the measuring line L1 passing through the base portion of the row of leads 2A that are laterally and parallelly bent is as shown in FIG. 7(*a*) and the brightness level from data D2 along the measuring line L2 at the tip portion is as shown in FIG. 7(*c*).

The center point A of a row of leads 2A along the measuring line L1 in the lateral direction is deviated from the center point B of the same row along the measuring line L2 by a difference X, which means there is a lateral parallel bend.

Then, if the center coordinate value XA1 of data D1 in FIG. 7(*b*) and the center value XB1 of data D2 in FIG. 7(*c*) are determined, the amount of lateral parallel bend X is given by $$X = XB1 - XA1 \tag{7}$$

Thus, if the following condition is satisfied $$X < \delta \tag{8}$$
($\delta$: a specified threshold value)

then the IC component is determined to have no lateral parallel bends.

The central coordinate values XA1, XB1 of a row of leads are calculated by $$XA1 = (Xk - X1)/2 + X1 \tag{9}$$
($Xk$, $X1$ are obtained from data $D1$.)

$$XB1 = (Xk - X1)/2 + X1 \tag{10}$$
($Xk$, $X1$ are obtained from data $D2$.)

With this embodiment, therefore, it is possible to cope with any kind of lead bends and detect them with accuracy.

Figure 8:
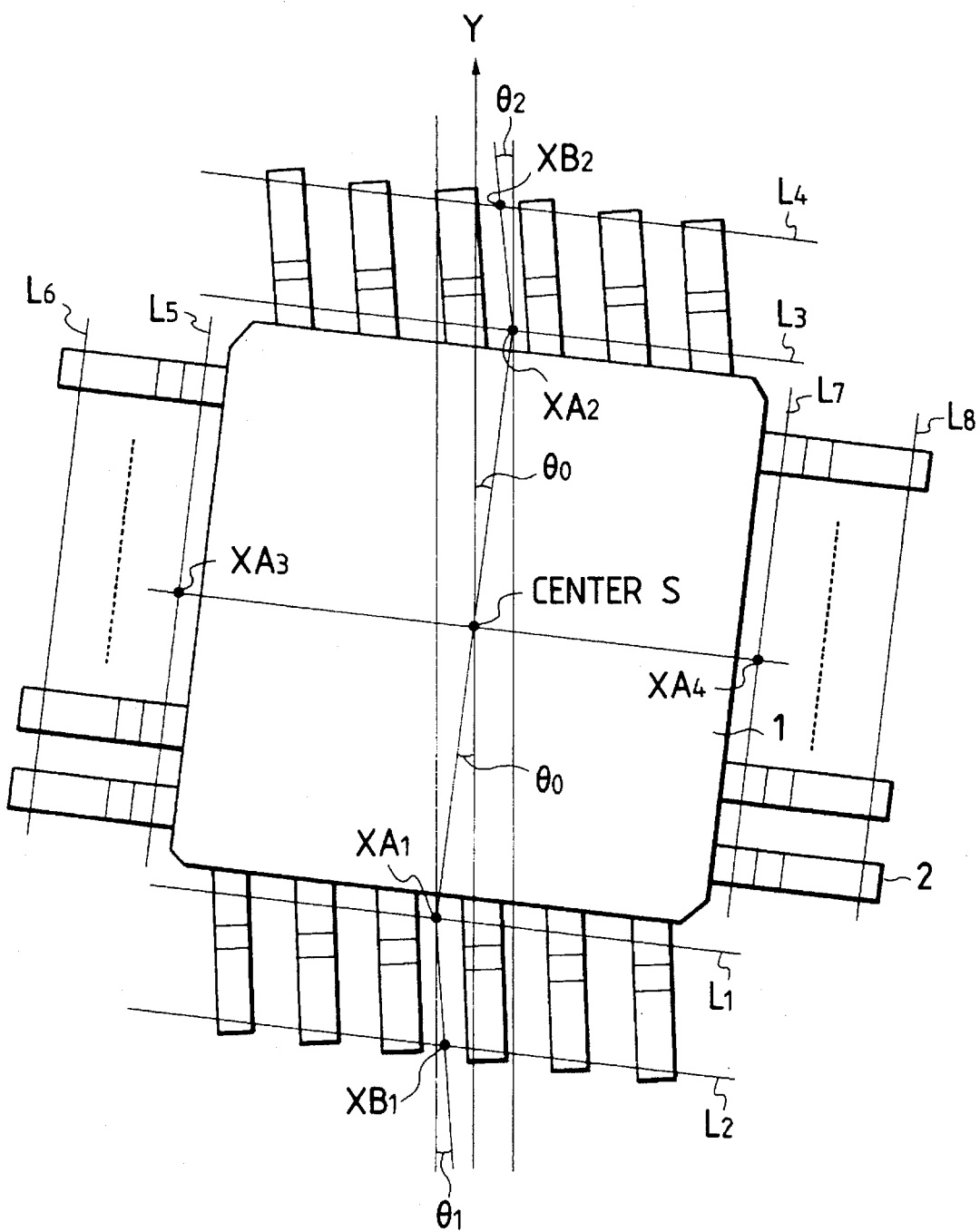
FIG. 8 is an explanatory view of the embodiment showing how the center position and the angular disalignment are detected.

Another embodiment for detecting the lateral parallel bent leads is described by referring to FIG. 8. In the embodiment of FIG. 8, the center S of the IC component 1 and the angular disalignment $\theta_0$ are determined simultaneously to calculate correction data which will be used during the process of mounting the IC components on the printed circuit cards.

First, as explained in FIG. 7, the center coordinates XA1, XA2, XA3, XA4 at the base portion of each row of leads along the measuring lines L1, L3, L5, L7 are calculated. Based on these center coordinates the center S and the IC misalignment $\theta_0$ are determined.

Next, the center coordinates XB1, XB2 at the tip portion of each row of leads along the measuring lines L2, L4 are determined, from which angular disalignments $\theta_1$, $\theta_2$ are calculated. These angular disalignments are checked to see if the following conditions are met.

$$\theta_0 - \theta_1 < \epsilon_1 \tag{11}$$
$$\theta_0 - \theta_2 < \epsilon_2 \tag{12}$$
($\epsilon_1$, $\epsilon_2$: specified threshold values)

If the above conditions are not met, the IC component is decided as having the parallel bent leads and discarded as faulty.

For the IC components that are found to have no bent leads, a positional correction is made by using the center S and the angular disalignment $\theta_0$ when mounting them on the card.

Now, referring to the flowchart of FIG. 9, an overall operation of this embodiment will be explained.

Figure 9A:
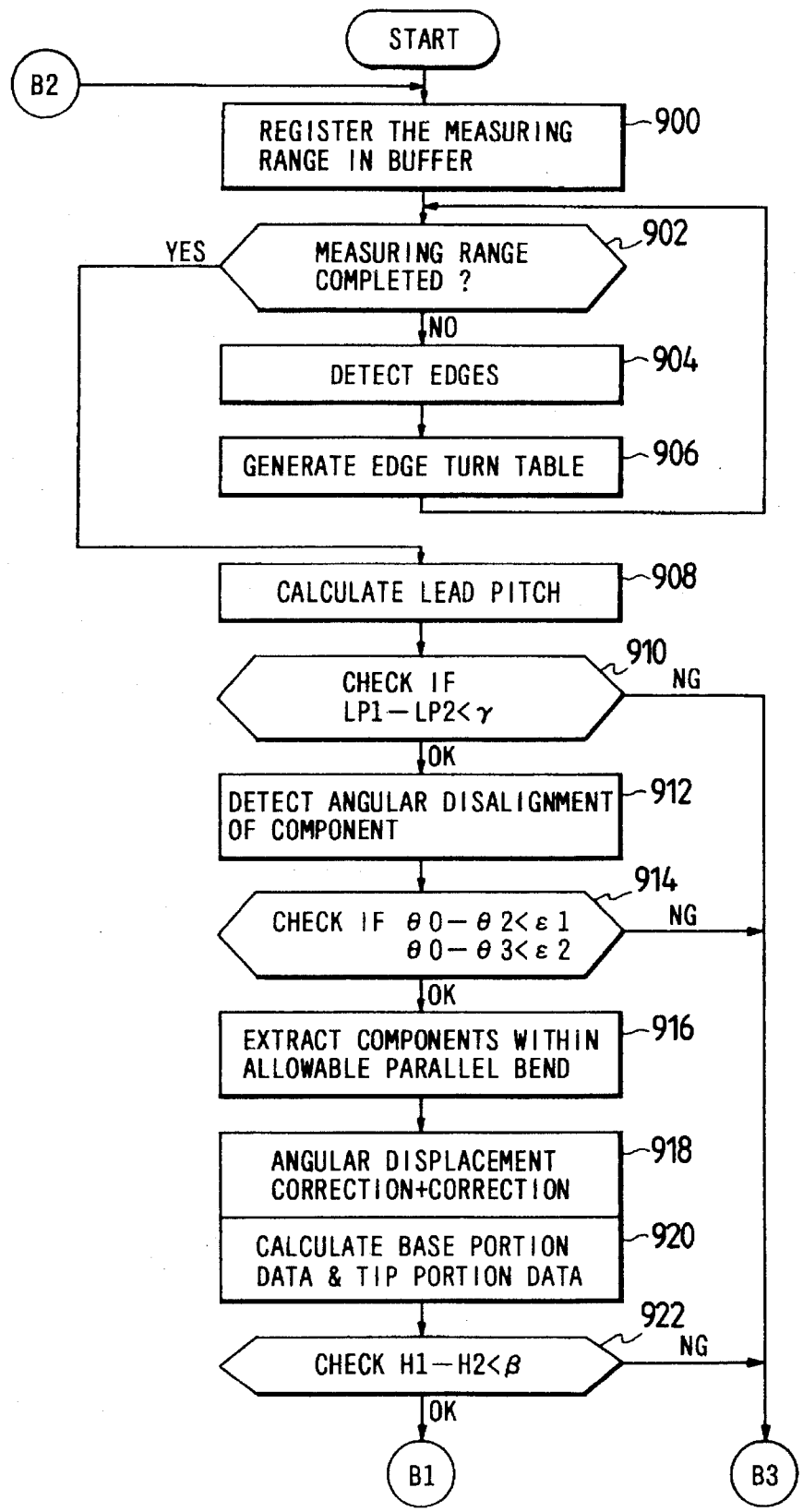
FIGS. 9(a) and 9(b) are flowcharts showing the operation of the embodiment.
Figure 9B:
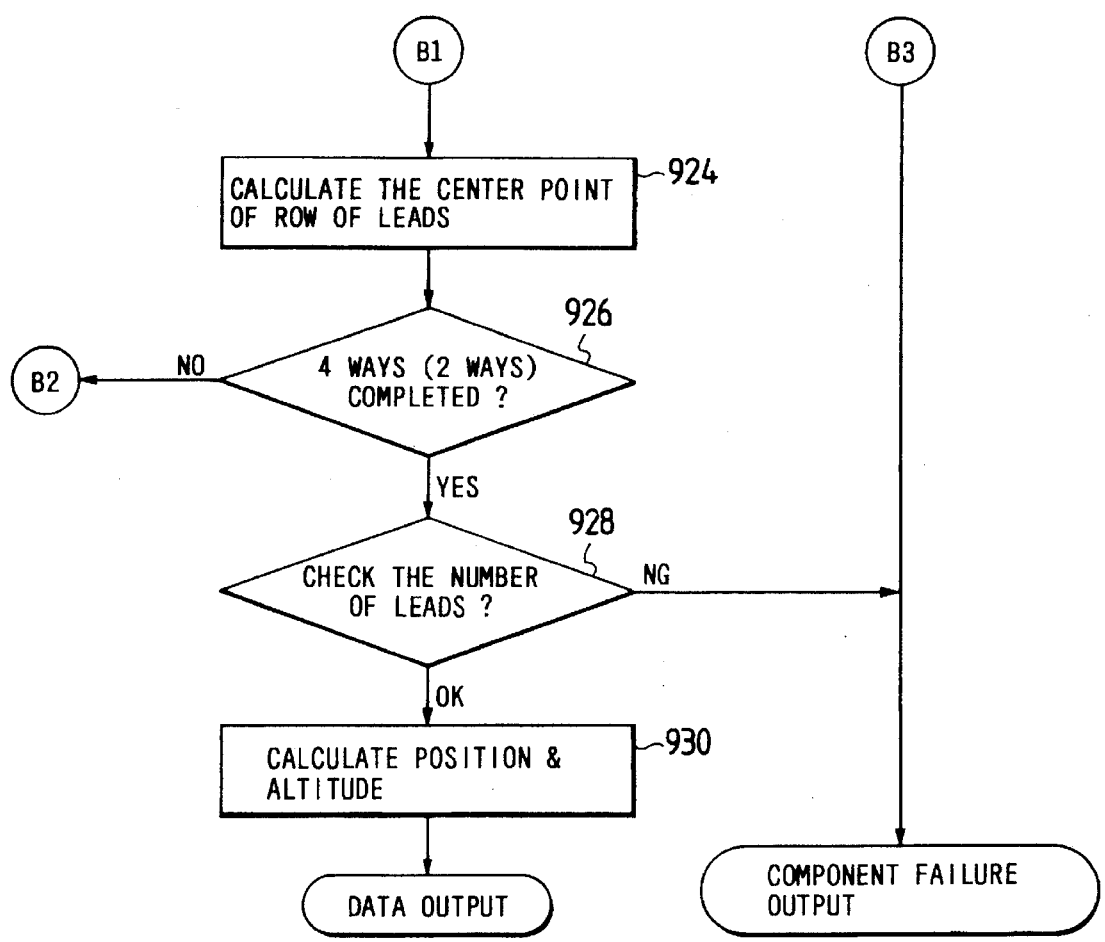

In FIGS. 9(*a*) and 9(*b*), at step 900, data on a specified row of leads along the measuring line L is transferred from the frame memory containing the image data to a specified buffer. At steps 904 and 906, depending on the decision of step 902, edge coordinates are detected and formatted into a table.

A step 908 calculates the pitch distance and a step 910 checks for a lateral bend of a lead.

At step 912, the flat package IC components with no lateral lead bends are checked for angular disalignment, which is then stored in memory. At the same time, $\theta_1$, $\theta_2$, $\theta_3$ are calculated.

A step 914 a check is made for any lateral parallel lead bends and at step 916 only those flat package IC components with no lead parallel bends are picked up.

A step 918 extracts the angular disalignment stored in memory at step 912 and performs angular positional corrections.

A step 920 calculates data along the base portion measuring line and data along the tip portion measuring line and these data are compared at step 922.

A step 924 performs processing for control of the IC component position with respect to the printed circuit card, a function required by the automatic IC component assembler to which this embodiment is applied.

At step 926 a check is made as to whether the above processing has been completed for all rows of leads of the IC component. That is, IC components in general have a plurality of rows of leads, for example four rows in the case of an IC component shown in FIG. 2. The above processing is repeated for each of the lead rows along the measuring lines. Generally, most of the IC components have two or four rows of leads.

At step 928, the number of leads are checked to determine whether the IC component is good or faulty.

At step 930, according to the result of the step 924, the IC component holding position and its attitude with respect to the suction hand 3 are detected, which is necessary for controlling the position with respect to the card.

Next, another embodiment for detecting the vertical bend in leads will be explained.

Figure 10A:
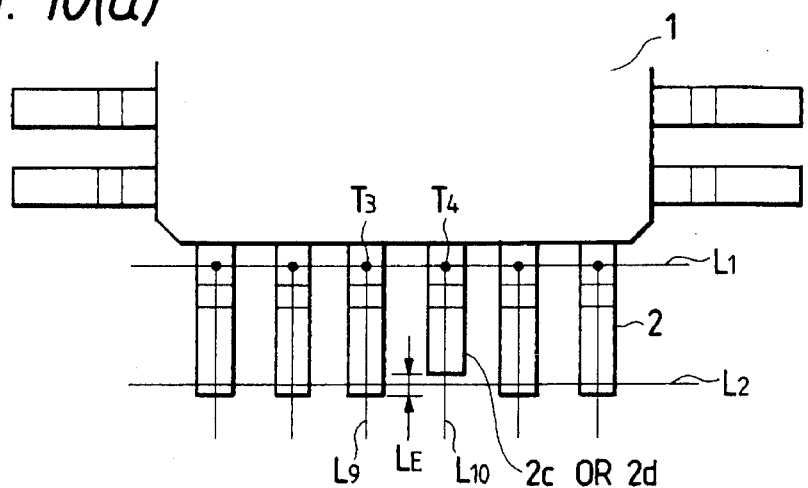
FIGS. 10(a) to 10(c) are explanatory views of the embodiment showing how the vertical bend is detected.
Figure 10B:
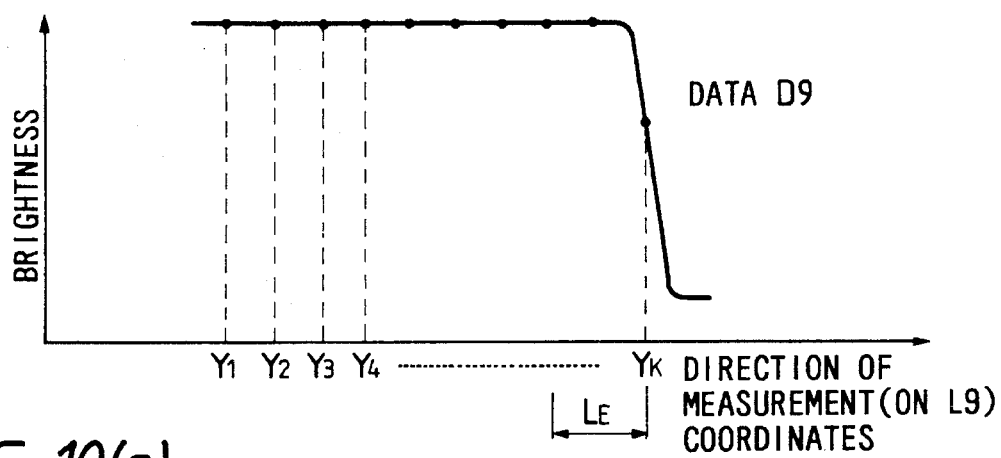
Figure 10C:
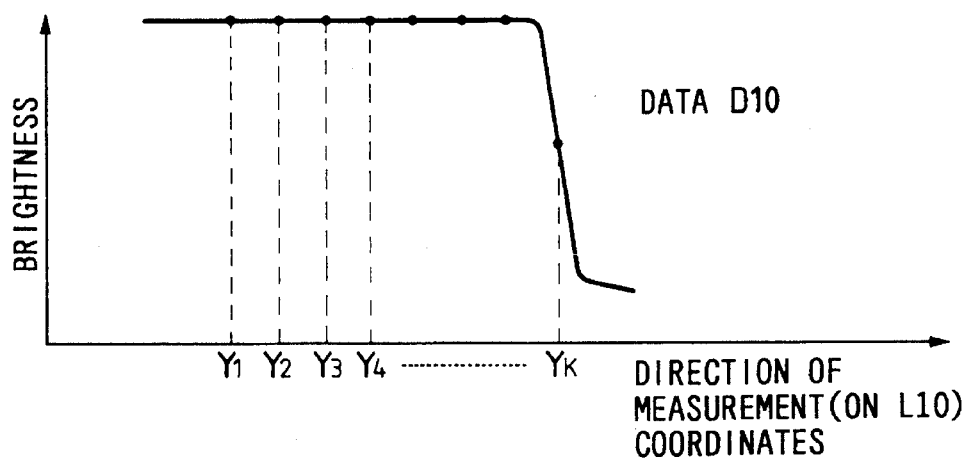

As shown in FIG. 10(*a*), by using the brightness contrast along the measuring line L1 at the base portion of leads where vertical or lateral bends will not easily occur, the widthwise center points T3, T4 of each lead are calculated by a brightness change point detection method.

Next, from these center points T3, T4, other measuring lines L9, L10 are extended in a direction perpendicular to the measuring lines L1, L2. One-dimensional image data D9, D10 along these measuring lines L9, L10 are extracted and they exhibit brightness variations as shown in FIGS. 10(*b*) and 10(*c*).

If we look at the lead 2c or 2d with a vertical bend in FIG. 10(*a*), it will be seen from FIG. 2(*b*) that the length of the lead in the direction of the measuring line L10 is smaller than that of other leads with no vertical bend, that is, the vertically bent lead has smaller coordinates. So there is a difference $L_E$ between them. The difference $L_E$ is calculated to see if the following condition is met or not.

$$L_E < \alpha \tag{13}$$
($\alpha$: a specified threshold value)

If the above condition (13) is not satisfied, the IC component is determined as having a vertical bent lead and treated as faulty.

Figure 11A:
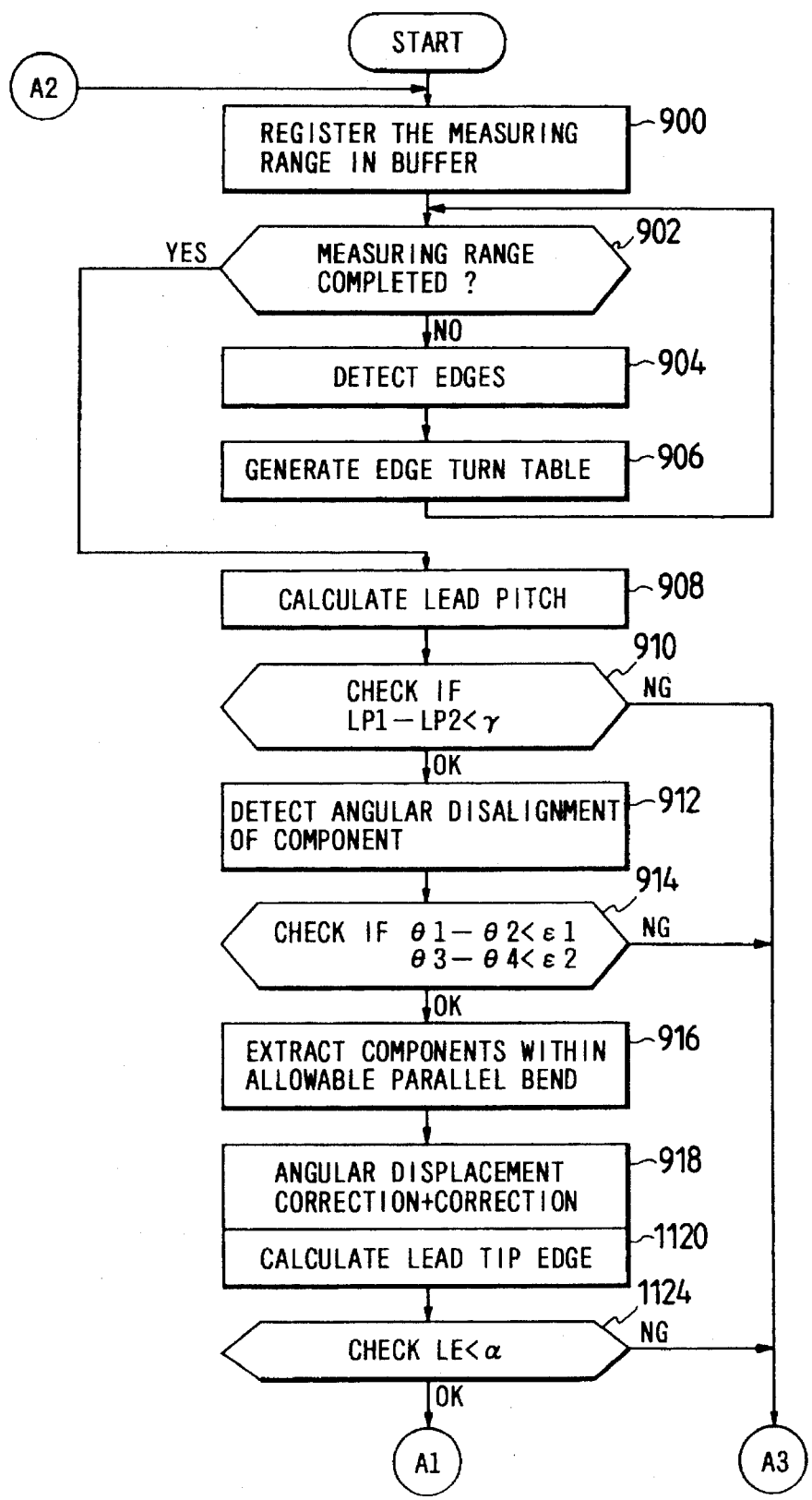
FIGS. 11(a) and 11(b) are operation flowcharts of another embodiment of the invention.
Figure 11B:
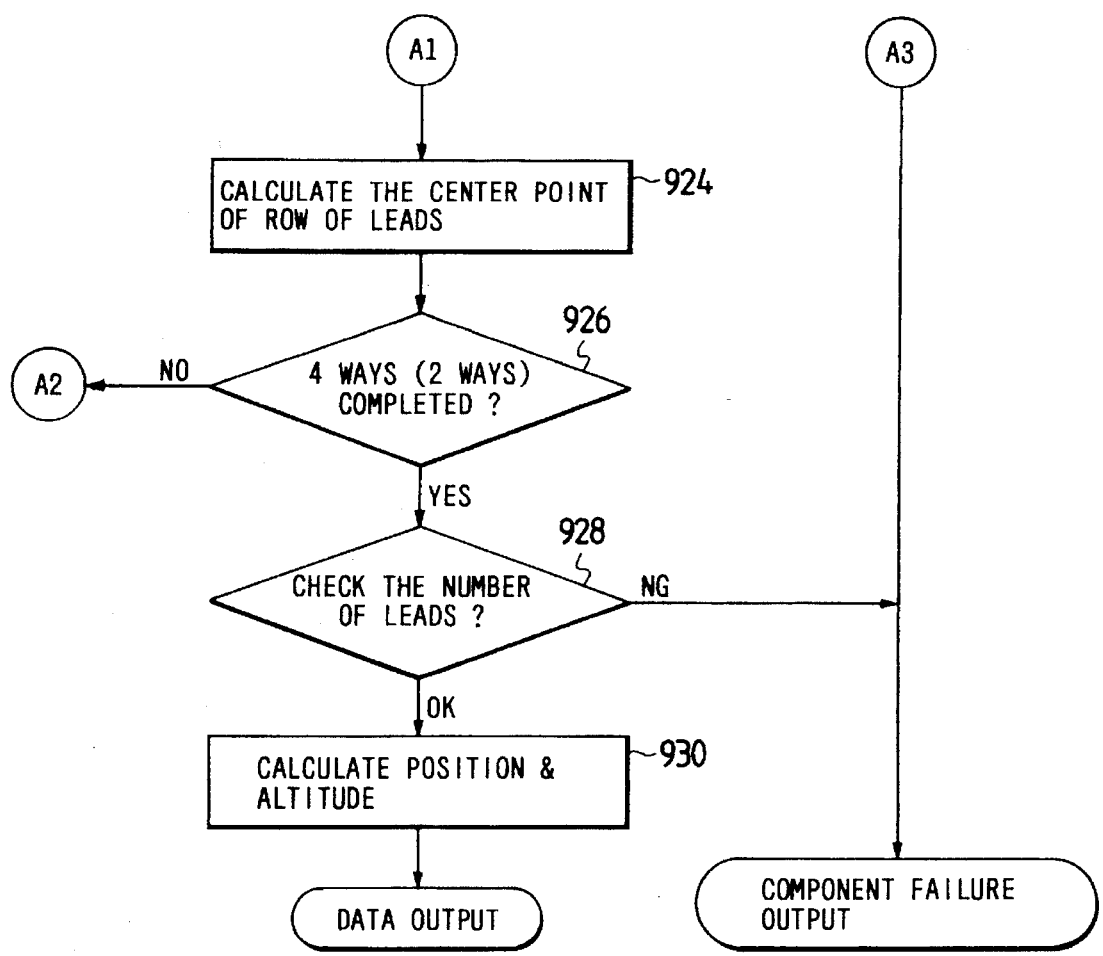

The processing flow of this embodiment is as shown in FIG. 11. The processing of FIG. 11 is similar to that of FIG. 9, except that steps 1120 and 1124 are provided instead of steps 920 and 922. At step 1120, the lead center coordinates calculated at step 908 are used to set a measuring line perpendicular to the lateral measuring line and determine the lead edge coordinates. This process is repeated for each lead, after which a check is made at step 1124 to decide whether there is a vertical bend in leads.

With the above processing, it is possible to cope with any form of lead bend by using the image data of FIG. 1 which is obtained by photographing and which covers the entire plan view of the IC component to be inspected. Also, the inspection result is not affected by variations in lead reflection factor due to differing kinds of IC components and lots or by variations in photographing conditions, thus making it possible to detect bent leads easily and with high accuracy.

Moreover, this invention allows detection of lead bend simultaneously with the detection and measurement of center position and angular disalignment of the IC component, so that the assembly time will not increase.

While a preferred embodiment has been set forth along with modifications and variations to show specific advantageous details of the present invention, further embodiments, modifications and variations are contemplated within the broader aspects of the present invention, all as set forth by the spirit and scope of the following claims.

We claim:

1. A method of detecting vertical bent leads, in a length direction of the leads, of an electronic component which has rows of parallel leads extending three-dimensionally from sides of a body of the electronic component, tips of the leads being aligned straight in each row, the method comprising the steps of:

photographing an entire plan view of the electronic component, and storing the photographed image as image data in a memory means;

reading the plan view image data of the electronic component stored in the memory means;

extracting one-dimensional coordinates of tips of objective leads to be measured based on a change of brightness represented in the plan view image data in the length direction of the respective leads;

detecting a difference ($L_E$) between the coordinates of adjacent tips in the length direction of the leads from the brightness variations; and determining that the electronic component has a vertical bent lead when the difference ($L_E$) is larger than a predetermined value.

2. A method of detecting vertical bent leads as claimed in claim 1, further comprising the steps of:

placing the electronic component at a predetermined location by a holding means;

calculating a lead pitch of each of said parallel leads in each row;

detecting an angular misalignment of said electronic component; and correcting the angular misalignment of said electronic component on the holding means.

3. A method of detecting vertical bent leads, in a length direction of the leads, of an electronic component which has rows of parallel leads extending three-dimensionally from sides of a body of the electronic component, tips of said leads being aligned straight for each row, the method comprising the steps of:

photographing an entire plan view of the electronic component, and storing the photographed image as image data in a memory means;

reading the plan view image data of the electronic component stored in the memory means;

setting a measuring line for each of said rows of parallel leads along and close to the electronic component body on the plan view image;

extracting one-dimensional coordinates of intersections of the measuring line and objective leads to be measured;

setting an auxiliary measuring line for each of said leads perpendicular to said measuring line to extend from the intersections to the tips of leads on the plan view image;

calculating a length from each intersection to the tip of each lead based on a variation of brightness of the plan view image along the auxiliary measuring line for each lead; and detecting that the electronic component has a vertical bent lead when the difference between said calculated length and a predetermined length is larger than a specified value.

4. A method of detecting vertical bent leads as claimed in claim 3, further comprising the steps of:

calculating a lead pitch of each of said parallel leads in each row along said measuring line;

detecting an angular misalignment of said electronic component; and correcting the angular misalignment of said electronic component.

5. A method of detecting vertical bent leads, in a length direction of the leads, of an electronic component which has rows of parallel leads extending three-dimensionally from sides of a body of the electronic component, tips of the leads being aligned straight in each row, the method comprising the steps of:

photographing an entire plan view of the electronic component, and storing the photographed image as image data in a memory means;

reading the plan view image data of the electronic component stored in the memory means;

setting a measuring line for each of said rows of parallel leads along and close to the electronic component body on the plan view image;

extracting one-dimensional coordinates of intersections of the measuring line and objective leads to be measured;

setting an auxiliary measuring line for each of said leads perpendicular to said measuring line to extend from the intersections to the tips of leads on the plan view image;

calculating lengths from the intersections to the tips of the leads based on a variation of brightness of the image along the auxiliary measuring line for each lead;

calculating difference ($L_E$) of the lengths between each objective lead and an adjacent lead;

comparing each difference with a specified threshold value; and determining that the electronic component has a vertical bent lead when any of the calculated differences is larger than the specified threshold value.

6. A method of detecting vertical bent leads as claimed in claim 5, further comprising the steps of:

placing the electronic component at a predetermined location by a holding means;

calculating a lead pitch of each of said parallel leads in each row;

detecting an angular misalignment of said electronic component; and correcting the angular misalignment of said electronic component on the holding means.

7. An apparatus for detecting vertical bent leads, in a length direction of the leads, of an electronic component which has rows of parallel leads extending three-dimensionally from sides of a body of the electronic component, tips of the leads being aligned straight in each row, the apparatus comprising:

photographing means for photographing an entire plan view of the electronic component;

memory means for storing plan view image data of the electronic component derived from said photographed plan view;

measuring line setting means for reading the plan view image data from the memory means and setting a measuring line for each of said rows of parallel leads along and close to the electronic component body on the plan view image;

extracting means for extracting one-dimensional coordinates of the tips of objective leads to be measured based on a change of brightness of the plan view image;

detecting means for detecting a difference ($L_E$) between the coordinates of the tips from the brightness variations; and determining means for determining whether the electronic component has a vertical bent lead by using the difference ($L_E$).

8. An apparatus for detecting vertical bent leads as claimed in claim 7, further comprising:

placing means for placing the electronic component at a predetermined location by a holding means;

calculating means for calculating a lead pitch of each of said parallel leads in each row;

detecting means for detecting an angular misalignment of said electronic component; and correcting means for correcting the angular misalignment of said electronic component on the holding means.

9. An apparatus for detecting vertical bent leads, in a length direction of the leads, of an electronic component which has rows of parallel leads extending three-dimensionally from sides of a body of the electronic component, tips of the leads being aligned straight in each row, the apparatus comprising:

photographing means for photographing an entire plan view of the electronic component;

memory means for storing plan view image data of the electronic component derived from said photographed plan view;

measuring line setting means for reading the plan view image data from the memory means and setting a measuring line for each of said rows of parallel leads along and close to the electronic component body on the plan view image;

extracting means for extracting one-dimensional coordinates of intersections of the measuring line and objective leads to be measured;

setting means for setting an auxiliary measuring line for each of said leads perpendicular to said measuring line to extend from the intersection to the tip of each lead on the plan view image;

calculating means for calculating lengths from the intersections to the tips of the leads based on a change of brightness of the plan view image along the auxiliary measuring line for each lead; and detecting means for detecting whether the electronic component has a vertical bent lead by using the calculated lengths.

10. An apparatus for detecting vertical bent leads as claimed in claim 9, further comprising:

placing means for placing the electronic component at a predetermined location by a holding means;

calculating means for calculating a lead pitch of each of said parallel leads in each row;

detecting means for detecting an angular misalignment of said electronic component; and correcting means for correcting the angular misalignment of said electronic component on the holding means.

11. An apparatus for detecting vertical bent leads, in a length direction of the leads, of an electronic component which has rows of parallel leads extending three-dimensionally from sides of a body of the electronic component, tips of said leads being aligned straight in each row, the apparatus comprising:

photographing means for photographing an entire plan view of the electronic component;

memory means for storing plan view image data of the electronic component derived from said photographed plan view;

measuring line setting means for reading the plan view image data from the memory means and setting a measuring line for each of said rows of parallel leads along and close to the electronic component body on the plan view image;

extracting means for extracting one-dimensional coordinates of intersections of the measuring line and objective leads to be measured;

setting means for setting an auxiliary measuring line for each of said leads perpendicular to said measuring line to extend from the intersection to the tip of each lead on the plan view image;

length calculating means for calculating lengths from the intersections to the tips of the leads based on a change of brightness of the image along the auxiliary measuring line for each lead;

difference calculating means for calculating differences of the lengths between each objective lead and an adjacent lead;

comparing means for comparing each difference with a specified threshold value; and determining means for determining that the electronic component has a vertical bent lead when any of the calculated differences is larger than the specified threshold value.

12. An apparatus for detecting vertical bent leads as claimed in claim 11, further comprising:

placing means for placing the electronic component at a predetermined location by a holding means;

calculating means for calculating a lead pitch of each of said parallel leads in each row;

detecting means for detecting an angular misalignment of said electronic component; and correcting means for correcting the angular misalignment of said electronic component on the holding means.

* * * * *